United States Patent
Elran

(10) Patent No.: US 7,889,018 B2
(45) Date of Patent: Feb. 15, 2011

(54) LOW VT DEPENDENCY RC OSCILLATOR

(75) Inventor: Tomer Shaul Elran, Petah Tikva (IL)

(73) Assignee: SanDisk Corporation, Milpitas, CA (US)

( * ) Notice: Subject to any disclaimer, the term of this patent is extended or adjusted under 35 U.S.C. 154(b) by 306 days.

(21) Appl. No.: 11/963,319

(22) Filed: Dec. 21, 2007

(65) Prior Publication Data

US 2009/0160521 A1    Jun. 25, 2009

(51) Int. Cl.
*H03L 1/00* (2006.01)

(52) U.S. Cl. .................. 331/176; 331/111; 331/143; 331/177 R

(58) Field of Classification Search .................. 331/1 R, 331/111, 143, 173, 176, 177 R, 179
See application file for complete search history.

(56) References Cited

U.S. PATENT DOCUMENTS

| | | | |
|---|---|---|---|
| 5,889,441 A | 3/1999 | Inn | 331/143 |
| 5,994,967 A * | 11/1999 | Nguyen | 331/1 R |
| 6,825,735 B2 | 11/2004 | Chung | 331/135 |
| 7,034,627 B1 * | 4/2006 | Kudari | 331/143 |
| 7,116,181 B2 | 10/2006 | Bakker | 331/111 |
| 7,233,213 B2 * | 6/2007 | Won | 331/143 |
| 2002/0021116 A1 | 2/2002 | Sirito-Olivier | 323/316 |
| 2002/0075083 A1 * | 6/2002 | Rashid | 331/36 C |
| 2007/0182495 A1 * | 8/2007 | Lall | 331/25 |

* cited by examiner

*Primary Examiner*—Joseph Chang
*Assistant Examiner*—Jeffrey Shin
(74) *Attorney, Agent, or Firm*—Weaver Austin Villeneuve & Sampson LLP

(57) ABSTRACT

An oscillator utilizes two current sources that have the same temperature and VDD dependency so they generate the same current in changing conditions. Therefore, there is very low VT dependency. The resistor and fringe capacitor temperature coefficient are very low and opposite so they compensate for each other. A comparator with a short period of operation also minimizes VT dependency.

9 Claims, 4 Drawing Sheets

LOW VT DEPENDENCY RC OSCILLATOR

BACKGROUND OF THE INVENTION

The present application relates to oscillators, and the use of oscillators in generating a system clock.

Oscillators and the circuit components employed in oscillators are dependent upon the environment they operate in. For example, oscillator signals fluctuate with temperature. It is desirable to minimize such voltage-temperature ("VT") fluctuation.

Prior ways to address the temperature induced fluctuations include:

1. Adding a compensation device (usually current compensation) to fix the temperature dependency.

2. Using temperature trimming calibrated only one time during sort (after the accurate temperature curve was found in lab tests).

3. Using a voltage regulator to correct the voltage dependency.

All the solutions above increase the circuit complexity, expand its size, reduce the yield in production or make the sorting process longer and more expensive. Furthermore, even after such solutions were incorporated, VT dependency is still unacceptably high, e.g. +/−7% at 100 MHz.

SUMMARY OF THE INVENTION

An oscillator utilizes two current sources that have the same temperature and VDD dependency so they generate the same current in changing conditions. Therefore, there is very low VT dependency. The resistor and fringe capacitor temperature coefficient are very low and opposite so they compensate for each other. A comparator with a short period of operation also minimizes VT dependency.

One aspect of an embodiment of the invention relates to a method of providing a clock signal in a memory device. The method comprises providing a first and a second current source, the first and second current source having the same $V_{GS}$, applying a current of the first current source to a resistor and generating a reference voltage, applying a current of the second current source to a capacitor and charging the capacitor, and when the capacitor voltage reaches the reference voltage the comparator output flips, discharging the capacitor and generating the clock signal.

DETAILED DESCRIPTION OF THE PREFERRED EMBODIMENTS

Figure 1:
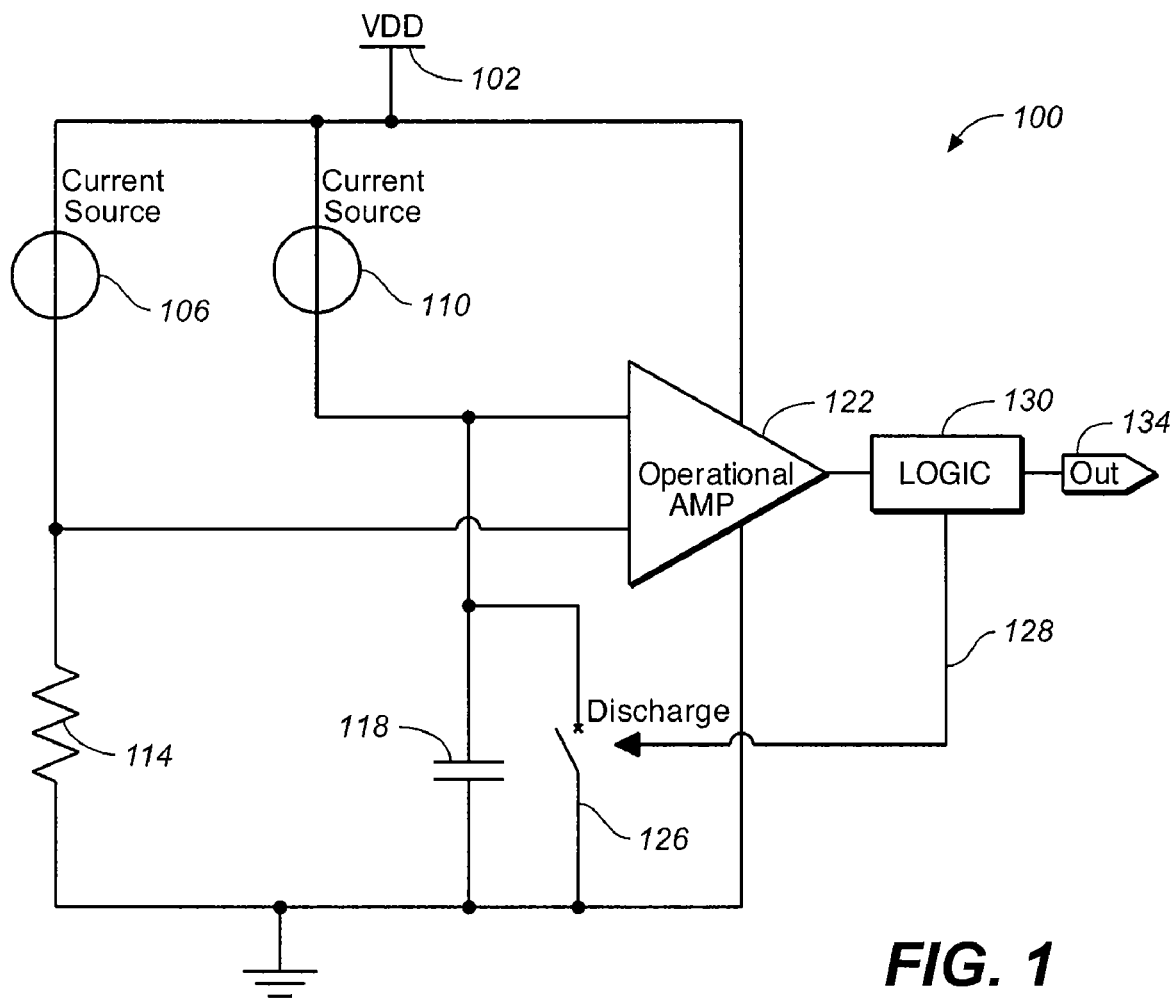
FIG. 1 is a block diagram of oscillator 100.

FIG. 1 illustrates oscillator 100, which may be used as an on chip internal oscillator. Oscillator 100 may be employed in many different environments, and in certain embodiments is employed to generate a system clock for use in a flash memory storage device or part of a larger system incorporating such a device, such as a music player, digital camera, or other computing device.

An input voltage ($V_{DD}$) 102 supplies current source 106 and current source 110 with the same input voltage. Current sources 106 and 110 are "mirrored." That is to say that they have the same or similar operating characteristics, and are preferably identical. In particular, they preferably employ the same internal voltage gate and have the same gate-source voltage $V_{GS}$. The output of current source 106 passes to resistor 114 and operational amplifier 122. The output of current source 100 passes to capacitor 118 and operational amplifier 122. Operational amplifier 122 may also be referred to as a comparator. Note the circuit interconnections to both the inputs ($V_+$, $V_-$) as well as the power supply terminals ($V_{S+}$, $V_{S-}$) of operational amplifier 122. The output of comparator 122 is connected to logical circuitry 130, which is connected to switch 126 via line 128. The output 134 of oscillator 100 is a square wave signal.

The current applied to resistor 114 generates a reference voltage and the current applied to capacitor 118 charges capacitor 118. When the capacitor 118 voltage reaches the reference voltage (from resistor 114) the comparator output flips and using logic block 130 triggers the capacitor 118 to discharge via line 128 and switch 126, thus generating the clock signal and setting the oscillator for another period.

The two current sources have the same temperature and VDD dependency so they generate the same current in changing conditions. Therefore, there is very low VT dependency. The resistor and fringe capacitor temperature coefficient are very low and opposite so they compensate for each other. The comparator is very fast so its error contribution for the VT dependency is also low, as can be seen in the equations below.

$$I*R=(I*t_{RC})/C \rightarrow t_{RC}=R*C$$

$$R=r0*(1+(dr/d\text{temp})*(\text{temp0}-\text{temp}))$$

$$C=c0*(1+(dc/d\text{temp})*(\text{temp0}-\text{temp}))$$

$$(dr/d\text{temp})\sim-(dc/d\text{temp}),x=(dr/d\text{temp})*(\text{temp0}-\text{temp})<3\%$$

$$t_{RC}=R*C=(r0(1+x))*(c0(1-x))=r0*c0(1-X^2)\sim r0*c0$$

$$t_{period}=t_{RC}+t_{comparator}$$

The oscillator has many advantages compared to previous designs. The oscillator has very low VT dependency. Early embodiments of the present invention exhibited around: +/−3%, whereas further refined embodiments have exhibited less than +/−1% with additional reductions in VT dependency expected. The oscillator has process trimming with 0.5 MHz resolution, and low current consumption as compared to previous designs. Preferred embodiments, for example have current consumption of less than 3 mA. In disable mode the oscillator has very low current consumption, or leakage current, so it is very suitable for portable and battery driven devices because it will not drain the battery when the device is not in use. The oscillator also occupies a very small area of about 0.02 mm². Thus, as compared to prior designs with larger circuits and high VT dependency, the present invention produces more economical and reliable electronic devices, especially when those devices are subjected to temperature swings, as is often the case with portable electronics such as memory cards, digital cameras, and music players etc.

Figure 2:
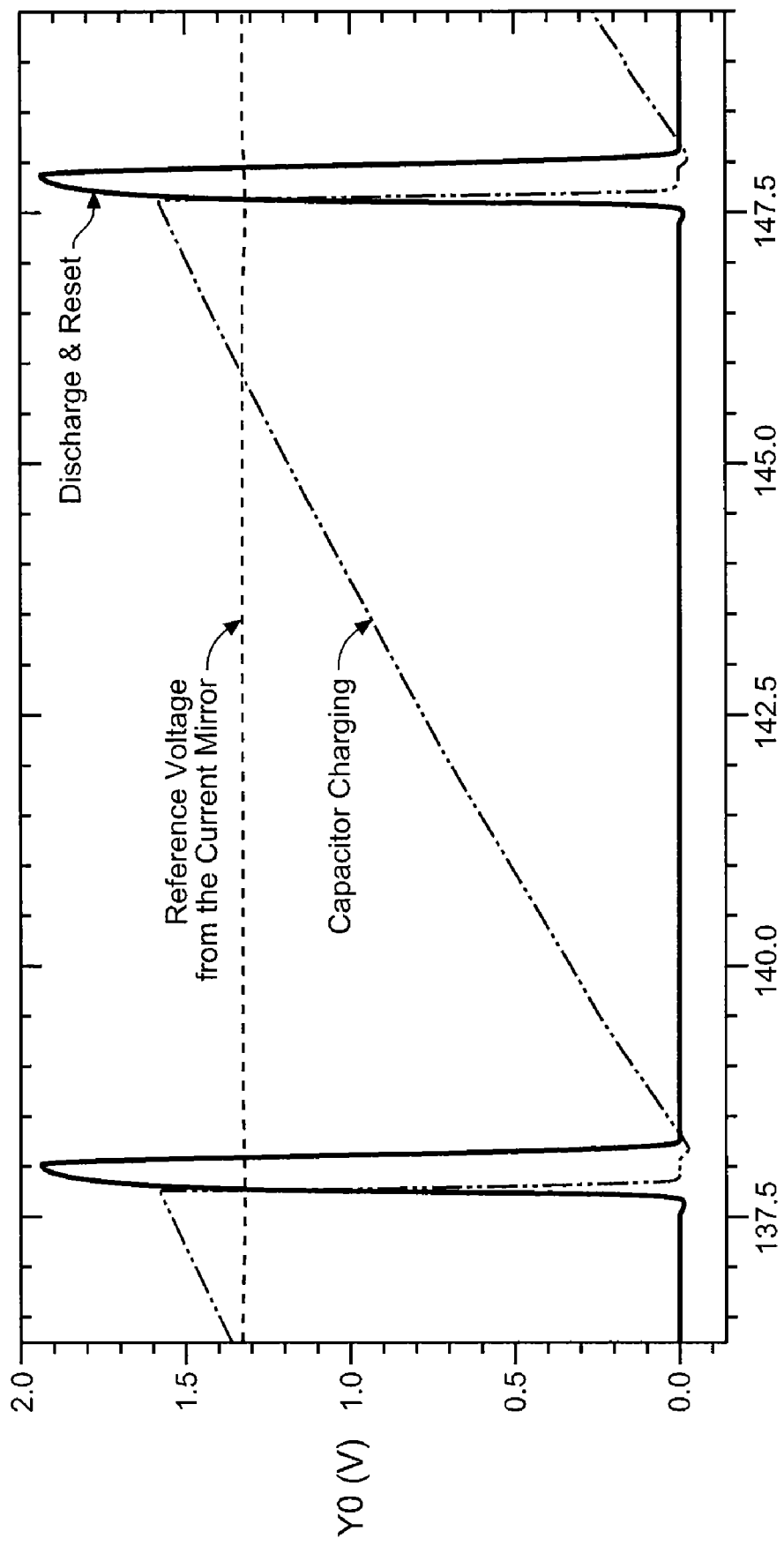
FIG. 2 is a graph of capacitor charging, discharging, and reset over time.
Figure 3:
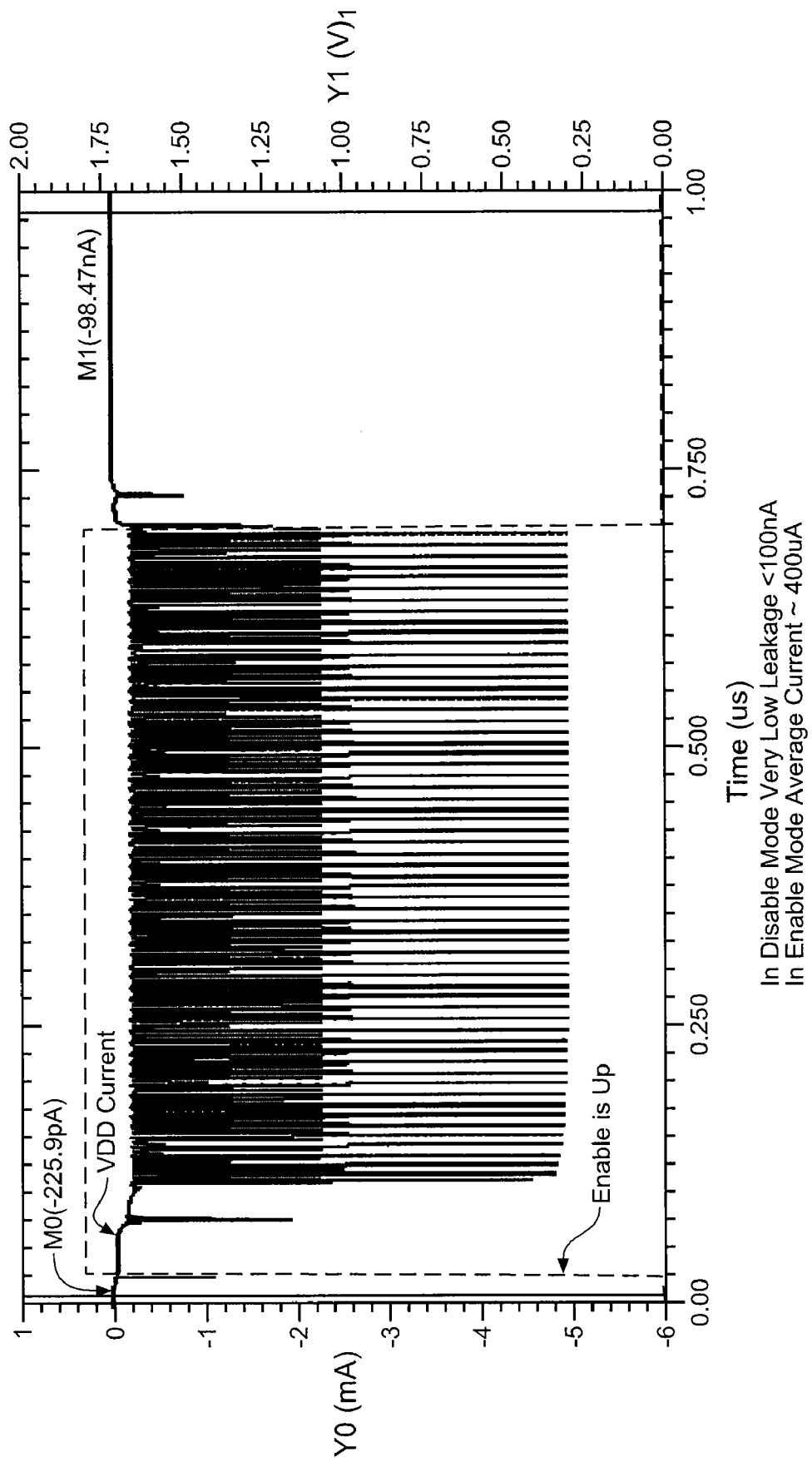
FIG. 3 is a graph of current consumption and transient response.
Figure 4:
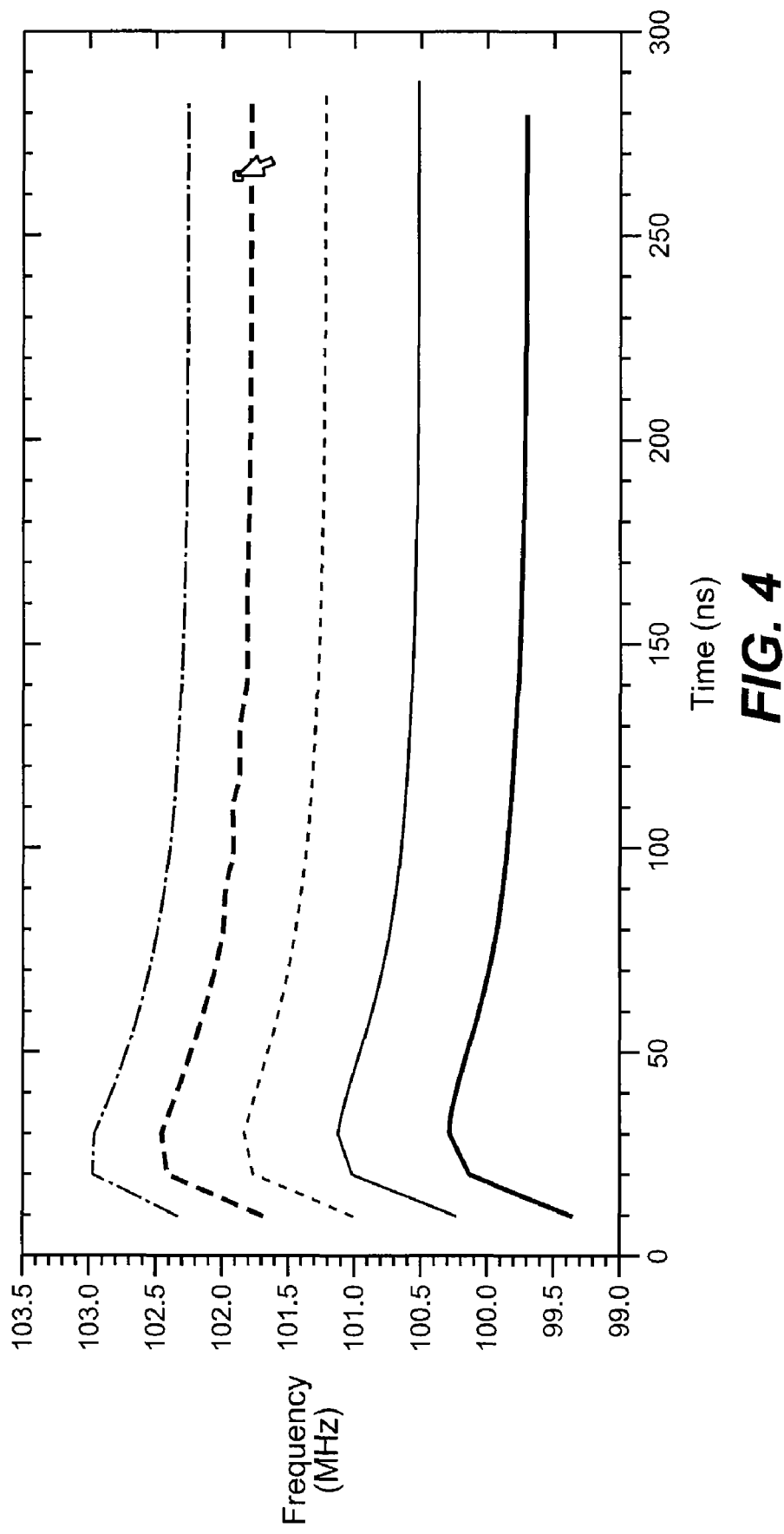
FIG. 4 is a graph of frequency over time at different temperatures.

FIGS. 2-4 illustrate the rapid transient response, low VT dependency, and low current consumption of oscillator embodiments according to the present invention. FIG. 2 is a graph illustrating capacitor charging, discharge, and reset over time. FIG. 3 is a graph of current consumption and transient response. Note the low current consumption when in enable mode and the low leakage current when in disable mode. FIG. 4 is a graph of frequency over time at different temperatures. Note the consistency in operation at different temperatures.

The following table illustrates some operating characteristics of one implementation or embodiment of the present invention. The table is provided for exemplary purposes and is not intended to limit the invention, as defined by the appended claims, in any way.

Electrical Characteristics:

Vdd33=2.7-3.6V Temperature: −40<Tj<125 C

| Parameter | symbol | conditions | min | typ | max | units |
|---|---|---|---|---|---|---|
| Power supply | VDD33 | Operating conditions | 2.7 | 3.3 | 3.6 | V |
| Vop - min operation power supply voltage | Vop | | | | 2.6 | V |
| Temp Trimming | Temp_trim<6:0> | Positive temp compensation | 0000000 | | 0111111 | b |
| | | negative temp compensation | 1000000 | | 1111111 | |
| Frequency calibration | Frequency_cal<10:0> | Process calibration & Fine tuning | 000h | | 7FFh | b |
| Minimum Frequency | | Frequency_cal<10:0> = 00h | 25 | | | MHz |
| Maximum frequency | | Frequency_cal<10:0> = 7FFh | | | 80 | MHz |
| Frequency resolution | | | 0.03 | 0.04 | 0.05 | MHz |
| Duty Cycle | | | 40 | 50 | 60 | % |
| Temp Dependency | After process & temp calibration | −40 < Tj < 125 | −0.2 | | 0.2 | % |
| VDD Dependency | | 2.7 < VDD < 3.6 | −0.05 | | 0.05 | % |
| Total peak Jitter: 3 sigma | | Clean VDD | | | 0.5 | % |
| Total peak Jitter: 3sigma | | VDD33 ± 500 mv ripple/ 10 Hz-10 MHz) | | | 1 | % |
| Start up time from Power up or disable | | To 99% of final value To 99.9% of final value (temp compensation circuit startup takes time when ss, −40 C.) | | | 2 400 | usec |
| Stabilization time from change of Calibration to 0.5% of final frequency | | | | | 0.5 | usec |
| Operating Current | Iop | | 0.8 | 1 | 1.5 | mA |
| Leakage current | Ileak | En = 0 | | | 0.1 | uA |
| Area | | | | | 0.24 | mm^2 |
| Max load on internal clock | | | | | 100 | fF |

What is claimed is:

1. An oscillator comprising:
  a first current source, the first current source characterized by:
    a first temperature dependency;
    a first input voltage dependency;
  a second current source, the second current source characterized by:
    a second temperature dependency;
    a second input voltage dependency;
  the first temperature dependency equal to the second temperature dependency, the first input voltage dependency equal to the second input voltage dependency;
  a reference voltage generated by applying a current of the first current source to a resistor;
  a capacitor coupled to an output of the second current source; and
  a comparator comprising an output and configured to change the output when the capacitor voltage reaches the reference voltage,
  wherein the change in resistance with temperature of the resistor is substantially equal in magnitude to the change in capacitance of the capacitor with temperature.

2. The oscillator of claim 1, wherein the change in resistance with temperature of the resistor is opposite in sign to the change in capacitance of the capacitor with temperature.

3. The oscillator of claim 1, further comprising logical circuitry coupled to the comparator and configured to discharge the capacitor.

4. The oscillator of claim 1, wherein the oscillator produces a signal in the range of approximately 50-200 MHz.

5. A method of providing a clock signal in a memory device, the method comprising:
  providing a first and a second current source, the first and second current source having the same $V_{GS}$;

applying a current of the first current source to a resistor and generating a reference voltage;

applying a current of the second current source to a capacitor and charging the capacitor; and when the capacitor voltage reaches the reference voltage generating the clock signal wherein the change in resistance/change in temperature of the resistor to which the first current source is applied is substantially equal in magnitude to the change in capacitance/change in temperature of the capacitor to which the second current source is applied.

6. The method of claim 5 wherein the change in resistance/change in temperature of the resistor to which the first current source is applied is approximately equal in magnitude but opposite in value to the change in capacitance/change in temperature of the capacitor to which the second current source is applied.

7. The method of claim 5 wherein the first current source has a first temperature dependency, and wherein the second current source has a second current dependency, the first and second current dependency substantially equal.

8. The method of claim 5, wherein the clock signal is provided in the range of approximately 50-200 MHz.

9. The method of claim 5, further comprising disabling the clock signal when the memory device is not active, and wherein an associated leakage current of the circuitry generating the clock signal is less than 0.1 microamperes.

* * * * *